(12) United States Patent
Miwa et al.

(10) Patent No.: US 10,069,060 B2
(45) Date of Patent: Sep. 4, 2018

(54) PIEZOELECTRIC CERAMIC ELECTRONIC COMPONENT AND METHOD FOR MANUFACTURING THE SAME

(71) Applicant: Murata Manufacturing Co., Ltd., Nagaokakyo-shi, Kyoto-fu (JP)

(72) Inventors: Yasunari Miwa, Nagaokakyo (JP); Shinichiro Kawada, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 361 days.

(21) Appl. No.: 14/921,036

(22) Filed: Oct. 23, 2015

(65) Prior Publication Data

US 2016/0049578 A1    Feb. 18, 2016

Related U.S. Application Data (63) Continuation of application No. PCT/JP2014/062262, filed on May 7, 2014.

(30) Foreign Application Priority Data

May 10, 2013   (JP) ................... 2013-100279

(51) Int. Cl.
*H01L 41/187* (2006.01)
*C01G 53/00* (2006.01)
(Continued)

(52) U.S. Cl.
CPC .......... *H01L 41/187* (2013.01); *C01G 53/006* (2013.01); *C04B 35/472* (2013.01);
(Continued)

(58) Field of Classification Search
CPC . H01L 41/187; H01L 41/0471; H01L 41/072; H01L 41/0986; H01L 41/1876;
(Continued)

(56) References Cited

U.S. PATENT DOCUMENTS

2003/0178918 A1* 9/2003 Ogawa ............... H01L 41/1878
310/366
2006/0006360 A1* 1/2006 Takao ................... C04B 35/495
252/62.9 R
(Continued)

FOREIGN PATENT DOCUMENTS

CN         1780011 A      5/2006
CN       101361204 A      2/2009
(Continued)

OTHER PUBLICATIONS

International Search Report issued for PCT/JP2014/062262, dated Aug. 12, 2014.
(Continued)

*Primary Examiner* — Thomas Dougherty
(74) *Attorney, Agent, or Firm* — Arent Fox LLP (57) ABSTRACT

A piezoelectric ceramic base body that has a polyhedral shape having shape anisotropy, such as a rectangular parallelepiped shape, and which has opposed faces on which external electrodes are formed. The opposed faces have first sides and second sides. Between the first side and the second side of one of the opposed faces, a width dimension of the surface in a direction orthogonal to the first side and the second side is larger than a length dimension of each of the first and the second sides. The crystal axis is {100} oriented in a direction parallel to the first and the second sides, and a degree of orientation by a Lotgering method is 0.4 or more.

7 Claims, 6 Drawing Sheets

(51) Int. Cl.
*H01L 41/43* (2013.01)
*H01L 41/09* (2006.01)
*C04B 35/472* (2006.01)
*C04B 35/491* (2006.01)
*C04B 35/622* (2006.01)
*H01L 41/047* (2006.01)
*H01L 41/37* (2013.01)

(52) U.S. Cl.
CPC ...... *C04B 35/491* (2013.01); *C04B 35/62218* (2013.01); *H01L 41/0471* (2013.01); *H01L 41/0472* (2013.01); *H01L 41/0986* (2013.01); *H01L 41/1876* (2013.01); *H01L 41/37* (2013.01); *H01L 41/43* (2013.01); *C01P 2002/34* (2013.01); *C01P 2002/72* (2013.01); *C04B 2235/3232* (2013.01); *C04B 2235/3244* (2013.01); *C04B 2235/3251* (2013.01); *C04B 2235/3279* (2013.01); *C04B 2235/3296* (2013.01); *C04B 2235/605* (2013.01); *C04B 2235/6025* (2013.01); *C04B 2235/6567* (2013.01); *C04B 2235/768* (2013.01); *C04B 2235/787* (2013.01)

(58) Field of Classification Search
CPC ... H01L 41/37; H01L 41/43; H01L 41/01876; C01G 53/006; C04B 35/472; C04B 35/491; C04B 35/62218
USPC ....... 310/358; 252/62.9 PZ, 62.9 R; 501/134
See application file for complete search history.

(56) References Cited

U.S. PATENT DOCUMENTS

| | | |
|---|---|---|
| 2006/0091353 A1 | 5/2006 | Matsushita et al. |
| 2006/0091588 A1* | 5/2006 | Nakamura ............ C04B 35/495 264/672 |
| 2008/0284284 A1 | 11/2008 | Kawada et al. |
| 2009/0185971 A1 | 7/2009 | Yokoyama et al. |
| 2009/0189489 A1 | 7/2009 | Yura et al. |
| 2013/0270965 A1* | 10/2013 | Hayashi ............... B41J 2/14233 310/328 |

FOREIGN PATENT DOCUMENTS

| | | |
|---|---|---|
| JP | 2004-006704 A | 1/2004 |
| JP | 2006-156976 A | 6/2006 |
| JP | 2008-037064 A | 2/2008 |
| JP | 2008-251916 A | 10/2008 |
| JP | 2009-167071 A | 7/2009 |
| JP | 2010-021512 A | 1/2010 |
| JP | 2010-090021 A | 4/2010 |
| JP | 2012-054299 A | 3/2012 |

OTHER PUBLICATIONS

Written Opinion of the International Searching Authority issued for PCT/JP2014/062262, dated Aug. 12, 2014.

* cited by examiner

PIEZOELECTRIC CERAMIC ELECTRONIC COMPONENT AND METHOD FOR MANUFACTURING THE SAME

CROSS REFERENCE TO RELATED APPLICATIONS

The present application is a continuation of International application No. PCT/JP2014/062262, filed May 7, 2014, which claims priority to Japanese Patent Application No. 2013-100279, filed May 10, 2013, the entire contents of each of which are incorporated herein by reference.

FIELD OF THE INVENTION

The present invention relates to a piezoelectric ceramic electronic component and a method for manufacturing the same and, in more particular, relates to a piezoelectric ceramic electronic component, such as a piezoelectric actuator, including a piezoelectric ceramic base body having a crystal orientation and a method for manufacturing the same.

BACKGROUND OF THE INVENTION

Piezoelectric ceramic electronic components are currently mounted in various electronic apparatuses, and for those piezoelectric ceramic electronic components, ceramic sintered bodies each primarily formed of a ceramic material have been widely used.

In addition, as a ceramic material used for a piezoelectric body, composite oxides (hereinafter referred to as "perovskite type compound"), such as lead titanate (hereinafter referred to as "PT") and lead zirconate titanate (hereinafter referred to as "PZT"), each having a perovskite type crystal structure have been widely used.

With this type of ceramic sintered body, it has been known that when the orientation of the crystal is controlled, various types of characteristics, such as piezoelectric characteristics, are improved. In addition, as related techniques on oriented ceramics, for example, the following Patent Documents 1 to 3 have been known.

Patent Document 1 has proposed a piezoelectric element which includes a substrate having a pair of main surfaces facing each other, a lower electrode layer disposed on one main surface of the substrate, a piezoelectric layer disposed on the lower electrode layer, and an upper electrode layer disposed on the piezoelectric layer, and in this piezoelectric element, the lower electrode layer described above is formed of a lanthanum nickelate ceramic.

In this Patent Document 1, a lanthanum nickelate ceramic preferentially oriented in the (100) plane of a pseudo-cubic crystal system is used as the lower electrode layer, and a PZT ceramic preferentially oriented in the (001) plane is formed on the lower electrode using a liquid phase growth method.

In addition, Patent Document 2 has proposed a crystal-oriented ceramic in which the crystal is oriented in a predetermined crystal plane, and in this crystal-oriented ceramic, an element contained therein has a composition distribution in a direction orthogonal to the above crystal plane, and the degree of orientation is 25% or more by a Lotgering method.

In this Patent Document 2, the crystal-oriented ceramic is formed by using a TGG (Templated Grain Growth) method. That is, after anisotropically shaped particles (template material) oriented along the c-axis and non-oriented inorganic particles are mixed together, a ceramic molded body is formed by molding this mixture and is then fired, so that the crystal-oriented ceramic is formed.

In addition, Patent Document 3 has proposed a piezoelectric/electrostritive film element including a ceramic sintered substrate, an electrode, and a piezoelectric/electrostrictive body which is provided on the ceramic sintered substrate directly or indirectly with the electrode interposed therebetween, which contains no glass components, and which is oriented in a specific direction.

This Patent Document 3 has disclosed a piezoelectric/electrostritive film element in which the pseudo-cubic (100) axis is oriented along an electric field direction.

Patent Document 1: Japanese Unexamined Patent Application Publication No. 2008-251916 (for example, claims 1 to 14)

Patent Document 2: Japanese Unexamined Patent Application Publication No. 2009-167071 (for example, claim 1 and paragraphs [0015] to [0022])

Patent Document 3: Japanese Unexamined Patent Application Publication No. 2010-021512 (for example, claims 1 and 10)

SUMMARY OF THE INVENTION

However, in Patent Document 1, although the PZT ceramic preferentially oriented in the (001) plane is formed on the lower electrode using a liquid phase growth method, and the crystal is oriented in a height direction of the piezoelectric layer, unfortunately, sufficient piezoelectric characteristics cannot be obtained.

In addition, in Patent Document 2, as is the case of Patent Document 1, the crystal is oriented in a height direction of the piezoelectric layer, and sufficient piezoelectric characteristics are also difficult to obtain. Furthermore, in Patent Document 2, since ceramic particles are oriented by a TGG method using anisotropically shaped particles, a manufacturing process is not only complicated, but also cracks caused by the anisotropically shaped particles are liable to be generated, and the reliability is also inferior.

In Patent Document 3, as the cases of Patent Documents 1 and 2, the crystal is oriented in a height direction of the piezoelectric layer, and hence, sufficient piezoelectric characteristics are difficult to obtain.

In consideration of the problems as described above, the present invention aims to provide a piezoelectric ceramic electronic component which can obtain preferable piezoelectric characteristics by enabling a piezoelectric ceramic base body to be crystal-oriented in a specific direction and a method for manufacturing the piezoelectric ceramic electronic component described above.

Through intensive research carried out by the present inventors to improve piezoelectric characteristics of a perovskite type compound, such as PZT, which has been widely used as a piezoelectric material, it was found that when the crystal axis is {100} oriented in a specific direction different from a height direction of a piezoelectric ceramic electronic component, the electromechanical coupling coefficient can be improved.

The present invention was made based on the findings as described above, and a piezoelectric ceramic electronic component according to an aspect of the present invention comprises a piezoelectric ceramic base body containing a composite oxide having a perovskite type crystal structure as a primary component and having at least one pair of opposed faces, and a pair of external electrodes formed on the surfaces of the opposed faces. In the piezoelectric ceramic electronic component described above, the piezoelectric ceramic base body has a polyhedral shape having shape anisotropy; the surfaces forming the opposed faces each have at least a first side and a second side parallel to each other; between the first side and the second side of one of the surfaces forming the opposed faces, a width dimension of the surface in a direction orthogonal to the first side and the second side is larger than a length dimension of each of the first side and the second side; the crystal axis of the piezoelectric ceramic base body is {100} oriented in a direction parallel or approximately parallel to the first side and the second side; and the degree of orientation by a Lotgering method is 0.4 or more.

In addition, the term "direction approximately parallel to" includes the case in which a slight variation, such as approximately ±15°, from the true parallel direction in geometrical point of view is generated.

In addition, the term "is {100} oriented" does not indicate the case in which the (100) plane is only oriented but indicates the case in which the (100) plane is not only oriented but the (010) plane and the (001) plane are also oriented.

In addition, the present invention may be applicable to various shapes which satisfy the above characteristics.

That is, in the piezoelectric ceramic electronic component of an aspect of the present invention, the polyhedral shape of the piezoelectric ceramic base body is preferably a rectangular parallelepiped shape.

Furthermore, in the piezoelectric ceramic electronic component of an aspect of the present invention, the opposed faces of the piezoelectric ceramic base body are each preferably formed at least to have a parallelogram shape.

In addition, in the piezoelectric ceramic electronic component of an aspect of the present invention, the opposed faces of the piezoelectric ceramic base body are each preferably formed at least to have a trapezoidal shape.

In addition, the piezoelectric ceramic electronic component of an aspect of the present invention preferably further comprises an internal electrode embedded in the piezoelectric ceramic base body.

Furthermore, in the piezoelectric ceramic electronic component of an aspect of the present invention, the width dimension is preferably 1.25 times or more the length dimension.

In addition, a method for manufacturing a piezoelectric ceramic electronic component of an aspect of the present invention comprises: forming a ceramic raw material powder containing a composite oxide having a perovskite type crystal structure as a primary component; forming a ceramic slurry by slurrying the ceramic raw material powder; applying the ceramic slurry to a transport film; and applying a magnetic field in an in-plane direction of the ceramic slurry using a hollow electromagnet disposed so that an axis direction thereof coincides with a transport direction of the transport film to form a molded body to which the crystal orientation is imparted.

In addition, a method for manufacturing a piezoelectric ceramic electronic component of an aspect of the present invention comprises: forming a ceramic raw material powder containing a composite oxide having a perovskite type crystal structure as a primary component; forming a ceramic slurry by slurrying the ceramic raw material powder; applying the ceramic slurry to a transport film; and applying a magnetic field in an in-plane direction of the ceramic slurry using a plurality of hollow electromagnets disposed to face each other with a transport path for the transport film located therebetween so as to form a molded body to which the crystal orientation is imparted.

According to the piezoelectric ceramic electronic component of an aspect of the present invention, since one axis of the crystal axes of a perovskite type crystal structure is oriented in one specific direction, the way of transmission of mechanical vibration energy in a direction in which the crystal axis is oriented becomes different from that in a direction orthogonal to the direction in which the crystal axis is oriented, and the transmission of vibration energy in the direction in which the crystal axis is oriented is reduced, so that the transmission of vibration energy is concentrated in the direction orthogonal to the direction in which the crystal axis is oriented.

Accordingly, for example, the electromechanical coupling coefficient is improved, and preferable piezoelectric characteristics can be obtained.

In addition, according to the method for manufacturing a piezoelectric ceramic electronic component of an aspect of the present invention, since the electromagnet is disposed in a wide range in the transport direction of the transport film, a magnetic field application region can be increased. Hence, a mass production of piezoelectric ceramic electronic components {100} oriented in a direction parallel or approximately parallel to the length dimension of each of the first and the second sides can be easily performed, so that a manufacturing method excellent in mass productivity can be realized.

In addition, according to the method for manufacturing a piezoelectric ceramic electronic component of an aspect of the present invention, the electromagnets can be separately disposed, so that an easy-to-use manufacturing method can be realized.

DETAILED DESCRIPTION OF THE PREFERRED EMBODIMENTS

Next, embodiments of the present invention will be described in detail with reference to the accompanying drawings.

Figure 1:
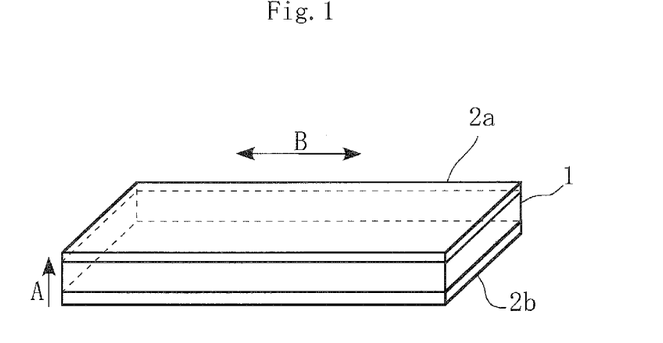
FIG. 1 is a perspective view schematically showing one embodiment of a piezoelectric ceramic electronic component according to the present invention.

FIG. 1 is a perspective view showing one embodiment of a piezoelectric ceramic electronic component of the present invention.

This piezoelectric ceramic electronic component includes a piezoelectric ceramic base body 1 formed to have a hexahedral shape (polyhedral shape) having shape anisotropy, that is, a rectangular parallelepiped shape, and external electrodes 2a and 2b formed on the entire outer surfaces of opposed faces of the ceramic base body 1 each functioning as a main surface.

In addition, in this embodiment, the piezoelectric ceramic base body 1 is processed by a polarization treatment in an arrow A direction, and by application of a voltage between the external electrodes 2a and 2b, the piezoelectric base body 1 is vibrated in an arrow B direction.

The piezoelectric ceramic base body 1 is primarily formed of a composite oxide having a perovskite type crystal structure (general formula: $ABO_3$). In particular, besides PT and PZT, for example, there may be mentioned $PbTi_{1-y}(MA^{II}_{1/2}MB^{V}_{1/2})_yO_3$ or $Pb(Ti, Zr)_{1-y}(MA^{II}_{1/2}MB^{V}_{1/2})_yO_3$ in which Ti or (Ti,Zr) functioning as a B site component is partially substituted by $(MA^{II}_{1/2}MB^{V}_{1/2})$ or $PbTi_{1-y}(MA^{III}_{2/3}MB^{VI}_{1/3})_yO_3$ or $Pb(Ti, Zr)_{1-y}(MA^{III}_{2/3}MB^{VI}_{1/3})_yO_3$ in which Ti or (Ti,Zr) is partially substituted by $(MA^{III}_{2/3}MB^{VI}_{1/3})$.

In this embodiment, $MA^{II}$ represents an element, such as Ni, Mn, Fe, Co, Zn, Sn, or Mg, capable of having a divalent value; $MA^{III}$ represents an element, such as Cr, capable of having a trivalent value; $MB^{V}$ represents an element, such as Nb or Sb, capable of having a pentavalent value; and $MB^{VI}$ represents an element, such as W, capable of having a hexavalent value.

In addition, although a composition molar ratio of the A site to the B site is 1.000 from a stoichiometric point of view, as long as the characteristics are not adversely influenced, if needed, the molar ratio may be set to A site rich or B site rich.

In addition, although the external electrodes 2a and 2b are not particularly limited, Ag and Cu, each of which is relatively inexpensive and has good electrical conductivity, and an Ag alloy and a Cu alloy, each of which is primarily formed therefrom, are preferably used.

Figure 2:
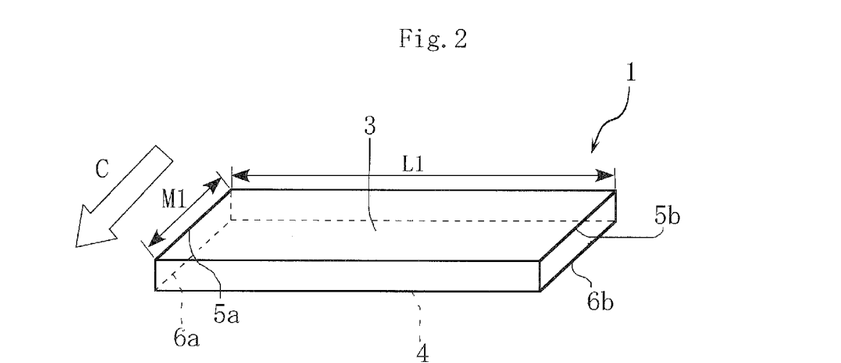
FIG. 2 is a perspective view showing a piezoelectric ceramic base body of the piezoelectric ceramic electronic component.

FIG. 2 is a perspective view of the piezoelectric ceramic base body 1.

In this piezoelectric ceramic base body 1, opposed faces 3 and 4 having surfaces on which the external electrodes 2a and 2b are formed include first sides 5a and 6a and second sides 5b and 6b which are in parallel to each other. In addition, between the first side 5a and the second side 5b of one opposed face 3 which is one of the opposed faces 3 and 4, a width dimension L1 of the surface in a direction orthogonal to the first side 5a and the second side 5b is formed so as to be larger than a length dimension M1 of each of the first and the second sides 5a, 6a, 5b, and 6b. In this embodiment, the width dimension L1 represents the length of a long side, and the length dimension M1 of each of the first and the second sides 5a, 6a, 5b, and 6b represents the length of a short side.

In addition, when this piezoelectric base body 1 is assumed to have a pseudo-cubic crystal system, the crystal axis thereof is {100} oriented. In particular, as shown by an arrow C, the crystal axis of the piezoelectric ceramic base body 1 is {100} oriented in a direction parallel to the first and the second sides 5a, 6a, 5b, and 6b.

In addition, the term "being {100} oriented" does not indicate the case in which the (100) plane is only oriented but indicates the case in which the (100) plane is not only oriented but the (010) plane and the (001) plane are also oriented.

As described above, when the crystal axis of the piezoelectric ceramic base body 1 is {100} oriented in a direction parallel to the first and the second sides 5a, 6a, 5b, and 6b, that is, parallel to the short sides, the electromechanical coupling coefficient can be increased, and the piezoelectric characteristics can be improved.

As a method to identify the orientation direction of crystal particles forming the piezoelectric ceramic base body 1, a method using an electron backscatter diffraction method (EBSD) and a method using a pole figure measurement by x-ray diffraction have been widely known.

In the case in which an electron backscatter diffraction method is used, after the piezoelectric ceramic base body 1 is cut and polished along an appropriate cross-section, squeezed electron beams are obliquely irradiated to this surface, and a Kikuchi pattern of backscattered electron beams is obtained. By analysis of this Kikuchi pattern, the crystal orientation of the place to which electron beams are irradiated is identified. After this analysis is performed in a wide range, such as a range including crystal particles in a number of 100 to 1,000 or more, using an electron microscope (SEM), the distribution of the crystal orientations of the individual particles is obtained, and the direction to which the distribution is concentrated can be regarded as the orientation direction.

In the case in which a pole figure measurement by x-ray diffraction is used, after the piezoelectric ceramic base body 1 is cut and polished along an appropriate cross-section, an angle at which x-rays are irradiated to this surface and an angle detecting x-rays reflected by this surface are independently driven. When the measurement results obtained thereby are mapped in a reciprocal lattice space, the orientation direction of the piezoelectric ceramic base body 1 can be identified.

Next, the piezoelectric ceramic base body 1 is cut and polished along a surface, the normal of which coincides with the identified orientation direction, and the degree of orientation is calculated from an x-ray diffraction pattern of this surface using a Lotgering method.

A Lotgering method has been widely known as an index evaluating the crystal orientation, and according to a Lotgering method, a degree of orientation F can be represented by the following equation (1).

[Eq. 1]

$$F = \frac{\frac{\Sigma I(HKL)}{\Sigma I(hkl)} - \frac{\Sigma Io(HKL)}{\Sigma Io(hkl)}}{1 - \frac{\Sigma Io(HKL)}{\Sigma I(hkl)}} \quad (1)$$

In the above equation, $\Sigma I(HKL)$ indicates the sum of x-ray peak intensities of a specific crystal plane (HKL) of an oriented sample, and $\Sigma I(hkl)$ indicates the sum of x-ray peak intensities of all crystal planes (hkl) of the oriented sample. In addition, $\Sigma I_0(HKL)$ indicates the sum of x-ray peak intensities of a specific crystal plane (HKL) of a reference sample, such as a non-oriented sample, and $\Sigma I_0(hkl)$ indicates the sum of x-ray peal intensities of all crystal planes (hkl) of the reference sample.

In addition, in order to obtain a sufficient electromechanical coupling coefficient, when the evaluation is performed by a Lotgering method, the degree of orientation F of the {100} orientation of the piezoelectric ceramic base body 1 is required to be 0.4 or more.

When the degree of orientation F of the {100} orientation of the piezoelectric ceramic base body 1 by a Lotgering method is less than 0.4, a sufficient electromechanical coupling coefficient cannot be obtained due to insufficient orientation.

Accordingly, in order to enable the degree of orientation F of the {100} orientation of the piezoelectric ceramic base body 1 by a Lotgering method as described above to have 0.4 or more, the crystal axis of the piezoelectric ceramic base body is {100} oriented in a direction approximately parallel to the first and the second sides 5a, 6a, 5b, and 6b. That is, the crystal axis of the piezoelectric ceramic base body is {100} oriented in a direction parallel to the short sides.

As described above, in the above piezoelectric ceramic electronic component, the piezoelectric ceramic base body 1 satisfies the following requirements (1) to (4). That is, the following four requirements are satisfied: (1) the faces having surfaces on which the external electrode are formed each have at least a first side and a second side parallel to each other; (2) between the first side and the second side of one surface forming the opposed face, a width dimension of the surface in a direction orthogonal to the first side and the second side is formed so as to be larger than a length dimension of each of the first and the second sides; (3) the crystal axis of the piezoelectric ceramic base body is {100} oriented in a direction parallel to the first and the second sides; and (4) the degree of orientation F by a Lotgering method is 0.4 or more.

As described above, since the crystal axis of the piezoelectric ceramic base body 1 is {100} oriented in a direction parallel to the first and the second sides which is different from a height direction, the electromechanical coupling coefficient can be increased, and the piezoelectric characteristics can be improved.

In addition, although the dimensional ratio L1/M1 of the width dimension L1 to the length dimension M1 is not particularly limited, the dimensional ratio is preferably 1.25 or more. When the dimensional ratio L1/M1 is less than 1.25, the piezoelectric ceramic base body 1 has a small anisotropy, and although the electromechanical coupling coefficient is increased as compared to that of non orientation, the rate of increase may be decreased in some cases.

As described above, in the piezoelectric ceramic electronic component of this embodiment, as long as the piezoelectric ceramic base body satisfies at least the above (1) to (4), various modifications thereof may be performed.

Hereinafter, various types of modified examples will be described with reference to FIGS. 3 to 7. In addition, the external electrodes are not shown in FIGS. 3 to 7.

Figure 3:
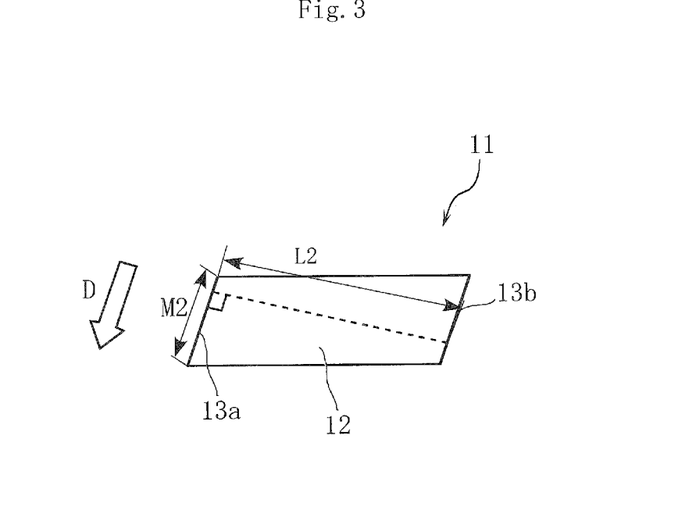
FIG. 3 is a plan view showing a first modified example of a piezoelectric ceramic base body to which the present invention is applied.

FIG. 3 is a plan view showing a first modified example, and an opposed face on which an external electrode is formed is formed to have a parallelogram shape.

That is, in a piezoelectric ceramic base body 11 of this first modified example, an opposed face 12 having a surface on which the external electrode is formed has a first side 13a and a second side 13b parallel to each other. In addition, as shown in FIG. 3, between the first side 13a and the second side 13b of the face 12, a width dimension L2 of the surface in a direction orthogonal to the first side 13a and the second side 13b is formed so as to be larger than a length dimension M2 of each of the first side 13a and the second side 13b.

In addition, as shown by an arrow D, the crystal axis of this piezoelectric ceramic base body 11 is {100} oriented in a direction parallel to the first and the second sides 13a and 13b so that the degree of orientation F by a Lotgering method is 0.4 or more.

As described above, the piezoelectric ceramic base body 11 of the first modified example satisfies the above (1) to (4). Hence, the electromechanical coupling coefficient can be improved, and a piezoelectric ceramic electronic component having preferable piezoelectric characteristics can be obtained.

Figure 4:
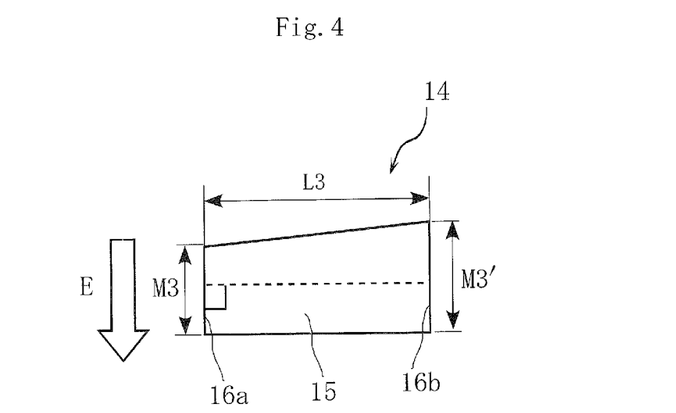
FIG. 4 is a plan view showing a second modified example of a piezoelectric ceramic base body to which the present invention is applied.

FIG. 4 is a plan view showing a second modified example, and an opposed face on which an external electrode is formed is formed to have a trapezoidal shape.

That is, in a piezoelectric ceramic base body 14 of this second modified example, an opposed face 15 having a surface on which the external electrode is formed has a first side 16a and a second side 16b parallel to each other. In addition, as shown in FIG. 4, between the first side 16a and the second side 16b of the face 15, a width dimension L3 of the surface in a direction orthogonal to the first side 16a and the second side 16b is formed so as to be larger than each of length dimensions M3 and M3' of the first side 16a and the second side 16b, respectively. In addition, as shown by an arrow E, the crystal axis of this piezoelectric ceramic base body 14 is {100} oriented in a direction parallel to the first side 16a and the second side 16b so that the degree of orientation F by a Lotgering method is 0.4 or more.

As described above, since the piezoelectric ceramic base body 14 of the second modified example satisfies the above (1) to (4), the electromechanical coupling coefficient can be improved, and a piezoelectric ceramic electronic component having preferable piezoelectric characteristics can be obtained.

Figure 5:
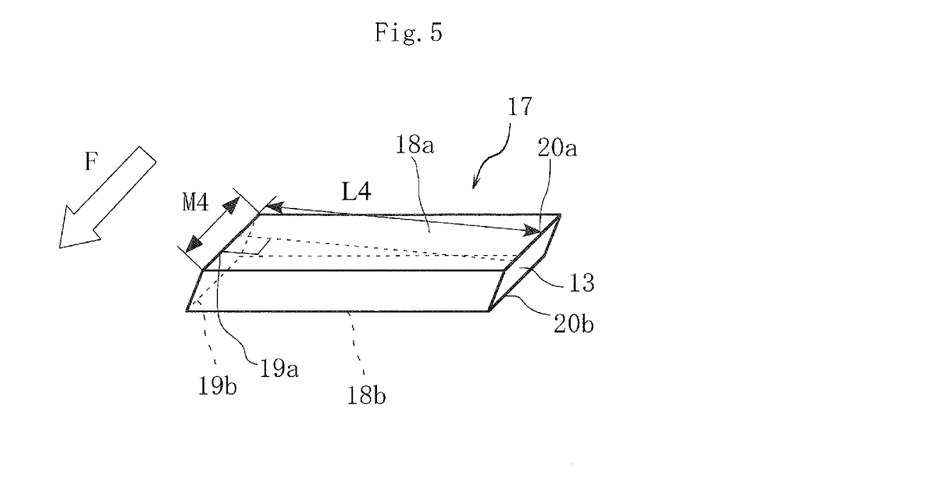
FIG. 5 is a plan view showing a third modified example of a piezoelectric ceramic base body to which the present invention is applied.

FIG. 5 is a perspective view showing a third modified example, and in this modified example, individual surfaces of a hexahedral body forming a piezoelectric ceramic base body are each formed to have a parallelogram shape, and external electrodes are formed on surfaces of two main faces.

That is, in a piezoelectric ceramic base body 17 of this third modified example, opposed faces 18a and 18b having surfaces on which the external electrodes are formed have first sides 19a and 19b and second sides 20a and 20b which are in parallel to each other. In addition, as shown in FIG. 5, between the first side 19a and the second side 20a of the face 18a, which is one of the opposed faces 18a and 18b, a width dimension L4 of the surface in a direction orthogonal to the first side 19a and the second side 20a is formed so as to be larger than a length dimension M4 of each of the first and the second sides 19a, 19b, 20a, and 20b. In addition, as shown by an arrow F, the crystal axis of this piezoelectric ceramic base body 17 is {100} oriented in a direction parallel to the first and the second sides 19a, 19b, 20a and 20b so that the degree of orientation F by a Lotgering method is 0.4 or more.

As described above, the piezoelectric ceramic base body 17 of the third modified example satisfies the above (1) to (4). Hence, the electromechanical coupling coefficient can be improved, and a piezoelectric ceramic electronic component having preferable piezoelectric characteristics can be obtained.

Figure 6:
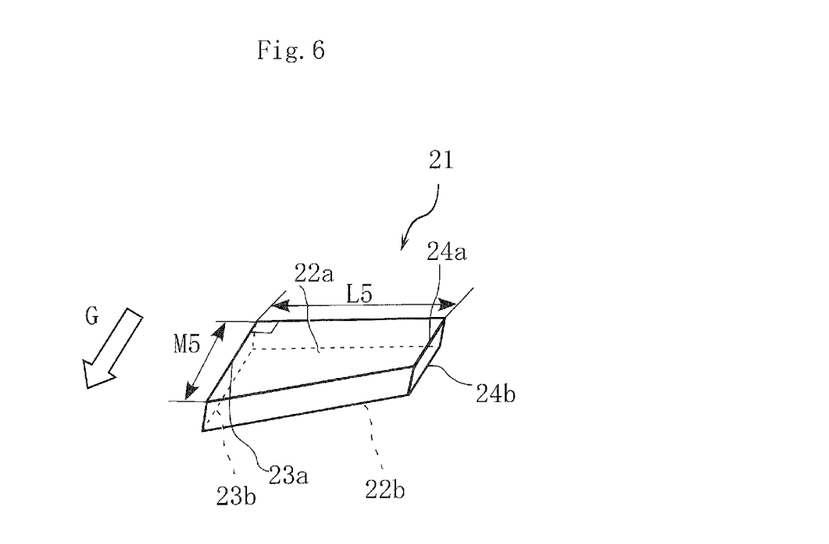
FIG. 6 is a plan view showing a fourth modified example of a piezoelectric ceramic base body to which the present invention is applied.

FIG. 6 is a perspective view showing a fourth modified example, and in this modified example, opposed faces of a piezoelectric ceramic base body 21 on which external electrodes are formed are each formed to have a trapezoidal shape, and the other four faces are each formed to have a parallelogram shape.

That is, in the piezoelectric ceramic base body 21 of this fourth modified example, opposed faces 22a and 22b having surfaces on which the external electrodes are formed have first sides 23a and 23b and second sides 24a and 24b which are in parallel to each other. In addition, as shown in FIG. 6, between the first side 23a and the second side 24a of the face 22a, which is one of the opposed faces 22a and 22b, a width dimension L5 of the surface in a direction orthogonal to the first side 23a and the second side 24a is formed so as to be larger than a length dimension M5 of each of the first and the second sides 23a, 23b, 24a, and 24b. In addition, as shown by an arrow G, the crystal axis of this piezoelectric ceramic base body 21 is {100} oriented in a direction parallel to the first and the second sides 23a, 23b, 24a and 24b so that the degree of orientation F by a Lotgering method is 0.4 or more.

As described above, since the piezoelectric ceramic base body 21 of the fourth modified example satisfies the above (1) to (4), the electromechanical coupling coefficient can be improved, and a piezoelectric ceramic electronic component having preferable piezoelectric characteristics can be obtained.

In addition, in this fourth modified example, although not shown in the figure, even when linear portions of the trapezoidal shape forming the opposed face which are not in parallel to each other are each formed to have a round shape or a chamfered shape, the above (1) to (4) are satisfied; hence, the electromechanical coupling coefficient can be improved, and a piezoelectric ceramic electronic component having preferable piezoelectric characteristics can be obtained.

Figure 7:
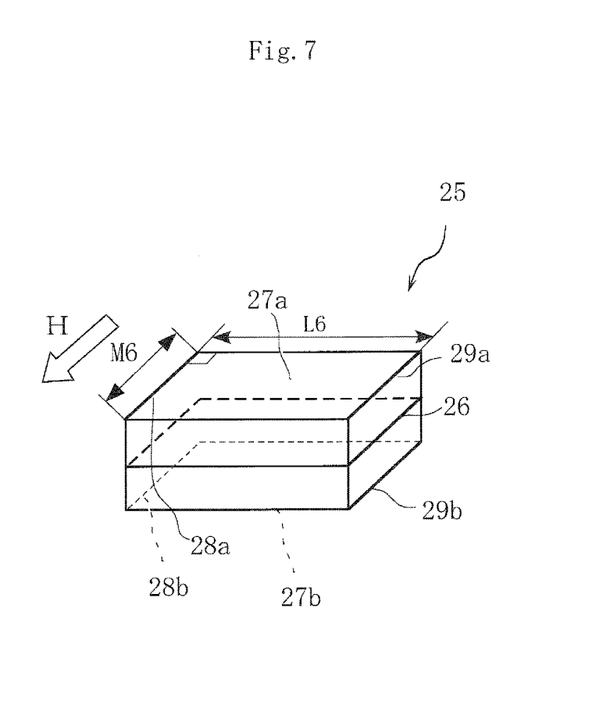
FIG. 7 is a plan view showing a fifth modified example of a piezoelectric ceramic base body to which the present invention is applied.

FIG. 7 is a perspective view showing a fifth modified example.

That is, in the fifth modified example, a piezoelectric ceramic base body 25 is formed to have a rectangular parallelepiped shape as a whole and also to have a laminate structure in which an internal electrode 26 having a flat shape is embedded.

In particular, in the piezoelectric ceramic base body 25, opposed faces 27a and 27b having surfaces on which external electrodes are formed have first sides 28a and 28b and second sides 29a and 29b which are in parallel to each other. In addition, as shown in FIG. 7, between the first side 28a and the second side 29a of the face 27a, which is one of the opposed faces 27a and 27b, a width dimension L6 of the surface in a direction orthogonal to the first side 28a and the second side 29a is formed so as to be larger than a length dimension M6 of each of the first and the second sides 28a, 28b, 29a, and 29b. In addition, as shown by an arrow H, the crystal axis of this piezoelectric ceramic base body 25 is {100} oriented in a direction parallel to the first and the second sides 28a, 28b, 29a and 29b so that the degree of orientation F by a Lotgering method is 0.4 or more.

As described above, the piezoelectric ceramic base body 25 of the fifth modified example satisfies the above (1) to (4). Hence, the electromechanical coupling coefficient can be improved, and a piezoelectric ceramic electronic component having preferable piezoelectric characteristics can be obtained.

In addition, in this fifth modified example, although the internal electrode 26 is formed to have a flat shape, the shape of the internal electrode 26 is not particularly limited. For example, after electrodes each having a line segment shape are prepared, at least two electrodes thereof may be electrically connected to each other or may be formed to have a coil shape, and those types of electrodes may also be used as the internal electrode described above.

Next, a method for manufacturing this piezoelectric ceramic electronic component will be described in detail.

Ceramic raw materials, such as $Pb_2O_4$, $TiO_2$, $ZrO_2$, NiO, and $Nb_2O_5$ are prepared, and predetermined amounts thereof are weighed. Subsequently, after those materials thus weighed are mixed together, the mixture formed as described above is charged together with a solvent, such as purified water, into a ball mill containing a pulverizing medium, such as PSZ (partially stabilized zirconia) balls or the like and is then mixed and pulverized. After drying is performed, calcination is performed at a temperature of 1,000° C. to 1,200° C., and dry pulverization is then performed, so that a ceramic raw material powder is obtained.

Next, this ceramic raw material powder, additives, such as a dispersant, and purified water are again charged into a ball mill together with a pulverizing medium and are sufficiently mixed and pulverized, so that a ceramic slurry 31 is obtained.

Subsequently, the ceramic slurry 31 is molded in a magnetic field and is then fired, so that a piezoelectric ceramic base body is obtained.

Figure 8:
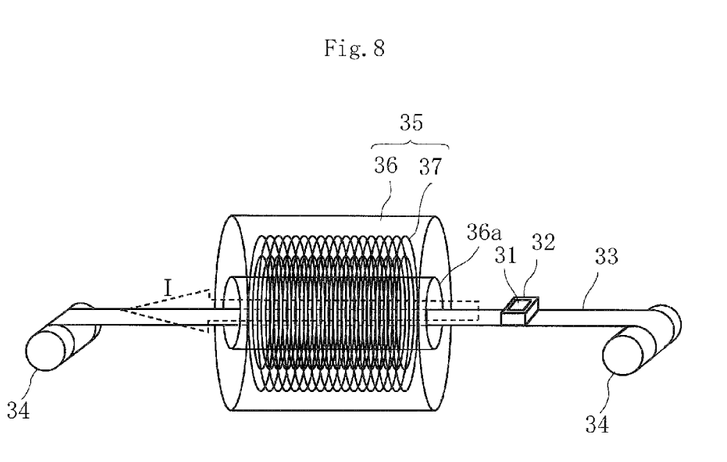
FIG. 8 is a view schematically showing one embodiment (first embodiment) of a molded body forming apparatus used for a method for manufacturing a piezoelectric ceramic electronic component of the present invention.

FIG. 8 is a perspective view showing one embodiment of a molded body forming apparatus forming a piezoelectric ceramic base body.

That is, this molded body forming apparatus includes a slurry container 32 having a doctor blade which stores the ceramic slurry 31; a belt-shaped carrier film (transport film) 33, such as a polyethylene terephthalate (PET) film, on which the ceramic slurry 31 discharged from the slurry container 32 is to be applied; transport rollers 34 transporting the carrier film 33 in a transport direction shown by an arrow I; and a hollow electromagnet 35, the axis direction of which is set along the transport direction of the carrier film 33. In particular, the electromagnet 35 is formed by winding a coil 37 around the outer circumference of a hollow portion 36a of a cylindrical magnet main body 36.

In the molded body forming apparatus formed as described above, after a ceramic slurry 31 molded to have a predetermined thickness by the doctor blade is discharged from the slurry container 32 and is applied on the carrier film 33, this ceramic slurry 31 is fed to the hollow portion 36a of the magnet main body 36. In addition, by applying electricity to the electromagnet 35, a magnetic field is applied in the transport direction shown by an arrow I, so that the crystal orientation is imparted to the ceramic slurry 31. Subsequently by drying, or by drying while a predetermined magnetic field is applied, for example, a piezoelectric ceramic molded body {100} oriented in a direction parallel to the short sides of a rectangular parallelepiped shape is formed. In addition, the transport direction is set along the surface of the ceramic slurry. In this case, the term "the surface of the ceramic slurry" means "the surface formed by the width dimension L1 and the length dimension M1 shown in FIG. 2".

Next, after this piezoelectric ceramic molded body is punched out into rectangular sheets, those sheets are laminated and pressure-bonded to each other so that the magnetic field directions thereof are set in the same direction, and firing is then performed, thereby forming a ceramic base body.

Subsequently, after an external-electrode conductive paste containing Ag or the like is applied to the surface of each opposed face, a firing treatment is performed.

Furthermore, a polarization treatment is performed by applying a predetermined electric field in a silicone oil controlled, for example, at a temperature of 80° C., so that a piezoelectric ceramic electronic component is formed.

As described above, in this embodiment, since the axis direction of the carrier film 33 is set to coincide with that of the electromagnet 35, and the carrier film 33 is transported in the axis of the electromagnet 35, the crystal axis of the piezoelectric ceramic base body can be easily oriented in an in-plane direction thereof. In addition, the electromagnet 35 can be disposed in a wide range along the transport direction of the carrier film 33, and hence, a magnetic field application region can be formed in a wide area. Accordingly, mass production of piezoelectric ceramic base bodies in each of which the crystal axis is {100} oriented in a direction parallel to the first and the second sides can be performed, so that a manufacturing method suitable for mass production can be realized.

Furthermore, anisotropically shaped particles are not required unlike the case of a TGG method, and hence the manufacturing process can be simplified. In addition, the shapes of particles forming a piezoelectric ceramic base body to be obtained can suppress the generation of cracks in a predetermined direction unlike the case of the shape anisotropy, so that the reliability can be ensured.

Figure 9:
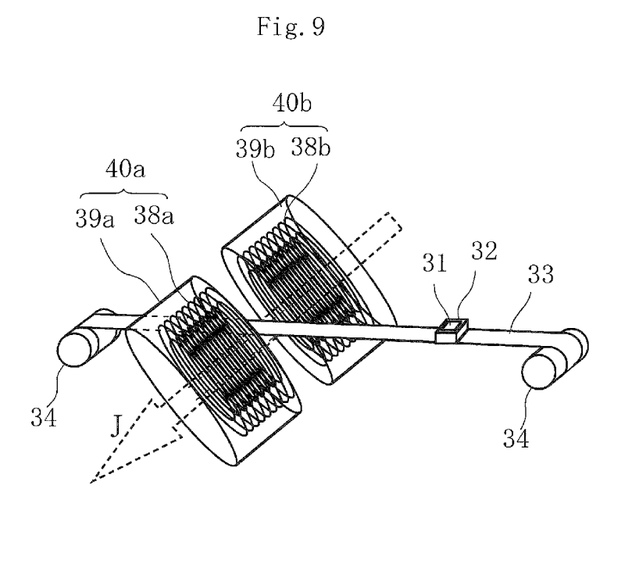
FIG. 9 is a view schematically showing a second embodiment of a molded body forming apparatus used for a method for manufacturing a piezoelectric ceramic electronic component of the present invention.

FIG. 9 is a perspective view showing a second embodiment of a molded body forming apparatus forming a piezoelectric ceramic base body.

That is, in this second embodiment, electromagnets 40a and 40b formed of cylindrical magnet main bodies 39a and 39b around which coils 38a and 38b are wound, respectively, are disposed with the carrier film 33 interposed therebetween so as to face each other in a direction parallel to the surface of the ceramic slurry 31.

In this second embodiment, since a magnetic field is applied in a direction parallel to the surface of the ceramic slurry 31 as shown by an arrow J, a piezoelectric ceramic base body {100} oriented in a direction parallel to the first and the second sides can be obtained. In addition, since the electromagnets 40a and 40b are separately disposed, an easy-to-use manufacturing method can be realized.

Incidentally, the present invention is not limited to the above embodiments and may be modified and changed without departing from the scope of the present invention. Although the modified examples of the present invention are shown in FIGS. 3 to 7, any modified examples may also be used as long as the above (1) to (4) are satisfied.

In addition, in the above embodiments, although the ceramic slurry is molded into a sheet during a manufacturing process, cast molding in which the ceramic slurry is charged into a mold and is then dried may also be used.

In addition, in the above embodiments, although the crystal axis is {100} oriented in a direction parallel to the first and the second sides, even if the true parallel direction is not obtained from a geometrical point of view, as long as an approximately parallel direction having a deviation of approximately ±15° is obtained, the effect and the advantage of the present invention are not adversely influenced.

Next, examples of the present invention will be described in detail.

Example 1

[Formation of Sample]
(Sample No. 1)

As ceramic raw materials, $Pb_3O_4$, $TiO_2$, $ZrO_2$, NiO, and $Nb_2O_5$ were prepared. Subsequently, after predetermined amounts of those ceramic raw materials were weighed, those materials thus weighed were charged into a ball mill together with purified water as a solvent and PSZ balls as a pulverizing medium and were then sufficiently mixed and pulverized in the ball mill.

Next, after the mixture thus obtained was dried, calcination was performed at a temperature of 1,100° C., and dry pulverization was then performed, so that a ceramic raw material powder represented by a composition formula of $Pb\{(Ti_{0.55}Zr_{0.45})_{0.73}(Ni_{1/3}Nb_{2/3})_{0.27}\}O_3$ was obtained.

Subsequently, 1.5 parts by weight of a dispersant and 40 parts by weight of purified water were added with respect to 25 g of the ceramic raw material powder and were then mixed and pulverized for 8 hours by a ball mill using PSZ balls, so that a ceramic slurry was obtained.

Next, after the above ceramic slurry was applied on a PET film and was then molded into a sheet, a magnetic field of 10 T was applied, drying was then performed, so that a piezoelectric ceramic molded body was formed.

Subsequently, this piezoelectric ceramic molded body was punched out into rectangular sheets, and the sheets thus obtained were laminated and pressure-bonded to each other so that the magnetic field application directions thereof were set in the same direction and were then fired at 1,100° C. for 3 hours, so that a ceramic sintered body of Sample No. 1 was obtained. In addition, the crystal contained in the sheet-shaped molded body is changed from a tetragonal crystal to a cubic crystal when the temperature exceeds a Curie point in a temperature rise step during the firing. Accordingly, the symmetrical property of the crystal is enhanced, and a crystallographical structure obtained by rotation of 180° with respect to the same direction as the magnetic field application direction is equivalent to the structure before rotation. Hence, in the step of laminating the sheet molded bodies, the sheet molded bodies may be laminated to each other in a direction obtained by rotation of 180° with respect to the direction of the magnetic field applied when the sheet molded body is formed.

Next, this ceramic sintered body was cut to have a long side L of 5.5 mm, a short side M of 4.4 mm, and a thickness T of 0.2 mm and to be {100} oriented in a direction parallel to the short sides. In addition, after an Ag paste containing Ag as a primary component was applied on the surface of an opposed face formed by the long side L and the short side M, a baking treatment was performed. Subsequently, after a polarization treatment was performed for 10 minutes by applying an electric field of 3 kV/mm in a thickness direction in a silicone oil at 80° C., the silicone oil was washed out, and drying was then performed, so that a piezoelectric ceramic electronic component of Sample No. 1 was formed.

(Sample No. 2)

Except that the magnetic field was not applied, a non-oriented piezoelectric ceramic electronic component of Sample No. 2 was formed by a method/procedure similar to that of Sample No. 1.

(Sample No. 3)

Except that a magnetic field of 5 T was applied to the ceramic slurry, a piezoelectric ceramic electronic component of Sample No. 3 was formed by a method/procedure similar to that of Sample No. 1.

(Sample No. 4)

Except that a magnetic field of 1 T was applied to the ceramic slurry, a piezoelectric ceramic electronic component of Sample No. 4 was formed by a method/procedure similar to that of Sample No. 1.

[Evaluation of Sample]

By the use of an x-ray diffraction measurement apparatus (characteristic x-rays: CuKα rays), an x-ray diffraction spectrum of a plane (T plane) orthogonal to a short side direction of each of Sample Nos. 1 to 4 was measured at a diffraction angle 2θ of 15° to 65°.

Figure 10:
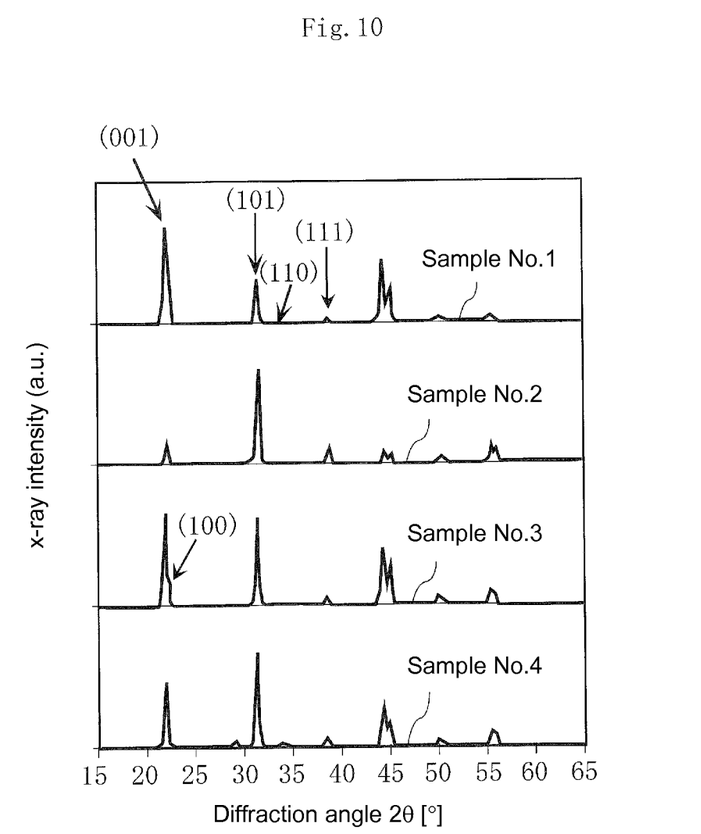
FIG. 10 is a view showing x-ray diffraction spectra of examples.

FIG. 10 shows the measurement results of the x-ray diffraction spectra. In the figure, the horizontal axis represents the diffraction angle 2θ, and the vertical axis represents the x-ray intensity (a.u.).

side M, the dimensional ratio L/M of the long side L to the short side, the electromechanical coupling coefficient $k_{31}$, and the rate of increase with respect to the non-oriented sample of each of Sample Nos. 1 to 4.

TABLE 1

| Sample No. | Orientation direction | Degree of orientation F (—) | Long side L (mm) | Short side M (mm) | L/M (—) | Electromechanical coupling coefficient $k_{31}$ (—) | Rate of increase with respect to non-oriented sample |
|---|---|---|---|---|---|---|---|
| 1 | Short side direction | 0.66 | 5.5 | 4.4 | 1.25 | 0.42 | 1.11 |
| 2* | Non-orientation | 0 | 5.5 | 4.4 | 1.25 | 0.38 | 1.00 |
| 3 | Short side direction | 0.43 | 5.5 | 4.4 | 1.25 | 0.40 | 1.05 |
| 4* | Short side direction | 0.18 | 5.5 | 4.4 | 1.25 | 0.38 | 1.00 |

*indicates out of the range of the present invention (Claim 1).

As apparent from FIG. 10, the diffraction peaks of the (001) plane and the (100) plane appear at a diffraction angle 2θ of 21° to 23°, the diffraction peaks of the (101) plane and the (110) plane appear at a diffraction angle 2θ of 30° to 32°, and the diffraction peak of the (111) plane appears at a diffraction angle 2θ of 38° to 39°.

Accordingly, from those x-ray diffraction spectra, the degree of orientation F was obtained.

That is, as described in "Description of Embodiments", according to a Lotgering method, the degree of orientation F can be calculated from the following equation (1).

[Eq. 2]

$$F = \frac{\frac{\Sigma I(HKL)}{\Sigma I(hkl)} - \frac{\Sigma Io(HKL)}{\Sigma Io(hkl)}}{1 - \frac{\Sigma Io(HKL)}{\Sigma I(hkl)}} \quad (1)$$

In addition, in this example, as the intensity of the x-ray peaks of all crystal planes (hkl), the intensities of the crystal planes (001), (100), (101), (110), and (111) described above were used. In addition, as the intensity of the x-ray peak of a specific crystal plane (HKL), the intensities of the crystal planes (001) and (100) were used. In addition, as a reference sample, the non-oriented Sample No. 2 was used.

That is, in the case of the PZT compound used in this example, although the compound is (100) oriented or (001) oriented at the stage of the piezoelectric ceramic molded body, as the temperature is increased by firing, the crystal system is changed from a tetragonal crystal system to a cubic crystal system, so that the (100) orientation cannot be distinguished from the (001) orientation. In addition, when the temperature is decreased to room temperature in this state, the (100) orientation and the (001) orientation again randomly appear. Hence, in this example, without distinguishing between the (100) orientation and the (001) orientation, it is assumed that the (100) orientation only occurs, and the degree of orientation F of the {100} orientation is obtained.

Next, an electromechanical coupling coefficient $k_{31}$ of each of samples of Sample Nos. 1 to 4 was measured by a resonance-antiresonance method using an impedance analyzer (4294A, manufactured by Agilent Technologies, Inc.).

Table 1 shows the orientation direction, the degree of orientation F, the dimensions of the long side L and the short According to Sample No. 4, since the degree of orientation F was small, such as 0.18, the electromechanical coupling coefficient $k_{31}$ was 0.38, was not different from that of the non-oriented sample, and could not be improved.

On the other hand, according to Sample Nos. 1 and 3, it was found that the degree of orientation F was large, such as 0.43 to 0.66, the electromechanical coupling coefficient $k_{31}$ was 0.40 to 0.42 and was increased to 1.05 to 1.11 times that of the non-oriented sample, and preferable piezoelectric characteristics could be obtained. The reason for this is believed as follows. Since one axis of the crystal axes of the perovskite type crystal structure is oriented in a specific direction, the way of transmission of mechanical vibration energy in the direction in which the crystal axis is oriented becomes different from that in the direction orthogonal thereto, and the transmission of vibration energy in the direction in which the crystal axis is oriented is reduced, so that the transmission of vibration energy is concentrated in the direction orthogonal to the direction in which the crystal axis is oriented.

Example 2

[Formation of Sample]
(Sample No. 11)
Except that the length of the long side L was set to 5.0 mm, and the length of the short side M was set to 2.2 mm, a sample of Sample No. 11 was formed by a method/procedure similar to that of Sample No. 1.

(Sample No. 12)
Except that the length of the long side L was set to 5.0 mm, the length of the short side M was set to 2.2 mm, and a magnetic field was applied so as to obtain the {100} orientation in a direction parallel to the long side L, a sample of Sample No. 12 was formed by a method/procedure similar to that of Sample No. 1.

(Sample No. 13)
Except that the length of the long side L was set to 5.0 mm, and the length of the short side M was set to 2.2 mm, a sample of Sample No. 13 was formed by a method/procedure similar to that of Sample No. 2.

[Evaluation of Sample]
The degree of orientation F and the electromechanical coupling coefficient $k_{31}$ of the sample of each of Sample Nos. 11 to 13 were measured by a method/procedure similar to that of Example 1.

Table 2 shows the orientation direction, the degree of orientation F, the dimensions of the long side L and the short side M, the dimensional ratio L/M of the long side L to the short side, the electromechanical coupling coefficient $k_{31}$, and the rate of increase with respect to the non-oriented sample of each of Sample Nos. 11 to 13.

TABLE 2

| Sample No. | Orientation direction | Degree of orientation F (—) | Long side L (mm) | Short side M (mm) | L/M (—) | Electromechanical coupling coefficient $k_{31}$ (—) | Rate of increase with respect to non-oriented sample |
|---|---|---|---|---|---|---|---|
| 11 | Short Side direction | 0.66 | 5.0 | 2.2 | 2.27 | 0.38 | 1.19 |
| 12* | Long side direction | 0.66 | 5.0 | 2.2 | 2.27 | 0.24 | 0.75 |
| 13* | Non-orientation | 0 | 5.0 | 2.2 | 2.27 | 0.32 | 1.00 |

*indicates out of the range of the present invention (Claim 1).

According to Sample No. 12, since the crystal axis is {100} oriented in a direction parallel to the long side L, the electromechanical coupling coefficient $k_{31}$ was decreased to 0.75 as compared to that of the non-oriented sample.

On the other hand, according to Sample No. 11, although the ratio L/M was increased to 2.27 as compared to that of the Sample No. 1 of Example 1 since the length of the short side M was set to 2.2 mm, the electromechanical coupling coefficient $k_{31}$ was increased to 0.38 and could be improved by 1.19 times that of the non-oriented sample.

Example 3

(Sample No. 21)
Except that the long side L was set to 6.2 mm, and the short side M was set to 5.6 mm, a sample of Sample No. 21 was formed by a method/procedure similar to that of Sample No. 1.

(Sample No. 22)
Except that the long side L was set to 6.2 mm, and the short side M was set to 5.6 mm, a sample of Sample No. 22 was formed by a method/procedure similar to that of Sample No. 2.

[Evaluation of Sample]
The degree of orientation F and the electromechanical coupling coefficient $k_{31}$ of the sample of each of Sample Nos. 21 and 22 were measured by a method/procedure similar to that of Example 1.

Table 3 shows the orientation direction, the degree of orientation F, the dimensions of the long side L and the short side M, the dimensional ratio L/M of the long side L to the short side, the electromechanical coupling coefficient $k_{31}$, and the rate of increase with respect to the non-oriented sample of each of Sample Nos. 21 and 22.

TABLE 3

| Sample No. | Orientation direction | Degree of orientation F (—) | Long side L (mm) | Short side M (mm) | L/M (—) | Electromechanical coupling coefficient $k_{31}$ (—) | Rate of increase with respect to non-oriented sample |
|---|---|---|---|---|---|---|---|
| 21** | Short side direction | 0.66 | 6.2 | 5.6 | 1.11 | 0.56 | 1.04 |
| 22* | Non-orientation | 0 | 6.2 | 5.6 | 1.11 | 0.54 | 1.00 |

*indicates out of the range of the present invention (Claim 1).
**indicates out of the range of the present invention (Claim 6).

It was found that according to Sample No. 21, since the dimensional ratio L/M was small, such as 1.11, although the electromechanical coupling coefficient $k_{31}$ was slightly improved to 0.56 as compared to that of the non-oriented sample, the rate of increase was only slightly improved to 1.04 times at most.

Example 4

[Formation of Sample]
(Sample No. 31)
Except that the piezoelectric ceramic base body was cut so that in a plane including a short side direction and a long side direction, a {100} oriented crystal axis was set in a direction inclined by 5° with respect to the short side direction, a sample of Sample No. 31 was formed by a method/procedure similar to that of Sample No. 13.

(Sample No. 32)
Except that the piezoelectric ceramic base body was cut so that in a plane including a short side direction and a long side direction, a {100} oriented crystal axis was set in a direction inclined by 15° with respect to the short side direction, a sample of Sample No. 32 was formed by a method/procedure similar to that of Sample No. 13.

(Sample No. 33)
Except that the piezoelectric ceramic base body was cut so that in a plane including a short side direction and a long side direction, a {100} oriented crystal axis was set in a direction inclined by 30° with respect to the short side direction, a sample of Sample No. 33 was formed by a method/procedure similar to that of Sample No. 13.

(Sample No. 34)
Except that the piezoelectric ceramic base body was cut so that in a plane orthogonal to a long side direction, a {100} oriented crystal axis was set in a direction inclined by 15° with respect to a short side direction, a sample of Sample No. 34 was formed by a method/procedure similar to that of Sample No. 13.

(Sample No. 35)
Except that the piezoelectric ceramic base body was cut so that in a plane orthogonal to a long side direction, a {100} oriented crystal axis was set in a direction inclined by 30° with respect to a short side direction, a sample of Sample No. 35 was formed by a method/procedure similar to that of Sample No. 13.

(Sample No. 36)

The piezoelectric ceramic base body was cut so that a {100} oriented crystal axis was set in a specific direction. That is, the {100} oriented crystal axis was first inclined by 15° with respect to a short side direction in a plane orthogonal to a long side direction and was then further rotated by 15° using the normal of a plane including a short side direction and a long side direction as a rotating axis. Except that described above, a sample of Sample No. 36 was formed by a method/procedure similar to that of Sample No. 13.

[Evaluation of Sample]

The degree of orientation F and the electromechanical coupling coefficient $k_{31}$ of the sample of each of Sample Nos. 31 to 36 were measured by a method/procedure similar to that of Example 1.

Table 4 shows the degree of orientation F, the dimensions of the long side L and the short side M, the dimensional ratio L/M of the long side L to the short side, the angle of the crystal axis inclined with respect to the short side direction, the electromechanical coupling coefficient $k_{31}$, and the rate of increase with respect to the non-oriented sample of each of Sample Nos. 31 to 36.

In addition, in the table, as the non-oriented sample used for the calculation basis of the rate of increase, Sample No. 13 of Example 2 was used.

was 1.12 to 1.19. In addition, according to Sample No. 36, since the electromechanical coupling coefficient $k_{31}$ was 0.35, and the rate of increase was 1.09, it was found that the electromechanical coupling coefficient $k_{31}$ was improved.

As described above, even when the crystal axis of the piezoelectric ceramic base body is in an approximately parallel state in which a slight deviation of approximately ±15° is generated with respect to the short side direction, various types of ceramic electronic components each having an improved electromechanical coupling coefficient $k_{31}$ and preferable piezoelectric characteristics can be obtained.

Various types of ceramic electronic components each having an improved electromechanical coupling coefficient and preferable piezoelectric characteristics can be obtained.

REFERENCE SIGNS LIST 1, 11, 14, 17, 21, 25 piezoelectric ceramic base body
2a, 2b external electrode
3, 4, 12, 15, 18a, 18b, 22a, 22b, 27a, 27b opposed face
5a, 6a, 13a, 16a, 19a, 19b, 23a, 23b, 28a, 28b first side
5b, 6b, 13b, 16b, 20a, 20b, 24a, 24b, 29a, 29b second side
26 internal electrode
31 ceramic slurry
33 carrier film (transport film)
35 electromagnet
40a, 40b electromagnet

TABLE 4

| Sample No. | Degree of orientation F (—) | Long side L (mm) | Short side M (mm) | L/M (—) | Angle of {100} oriented crystal axis inclined with respect to short side direction (°) | Electromechanical coupling coefficient $k_{31}$ (—) | Rate of increase with respect to non-oriented sample |
|---|---|---|---|---|---|---|---|
| 31 | 0.66 | 5.0 | 2.2 | 2.27 | 5 | 0.38 | 1.19 |
| 32 | 0.66 | 5.0 | 2.2 | 2.27 | 15 | 0.37 | 1.16 |
| 33* | 0.66 | 5.0 | 2.2 | 2.27 | 30 | 0.33 | 1.03 |
| 34 | 0.66 | 5.0 | 2.2 | 2.27 | 15 | 0.36 | 1.12 |
| 35* | 0.66 | 5.0 | 2.2 | 2.27 | 30 | 0.32 | 1.00 |
| 36 | 0.66 | 5.0 | 2.2 | 2.27 | 15 | 0.35 | 1.09 |

*indicates out of the range of the present invention (Claim 1).

It was found that according to Sample No. 33, since the direction of the {100} oriented crystal axis was significantly inclined by 30° with respect to the short side direction in the plane including the short side direction and the long side direction, although the electromechanical coupling coefficient $k_{31}$ was slightly improved to 0.33 as compared to that of the non-oriented sample ($k_{31}$=0.32), the rate of increase was low, such as less than 1.05.

In addition, it was also found that according to Sample No. 35, since the direction of the {100} oriented crystal axis was significantly inclined by 30° with respect to the short side direction in the plane orthogonal to the long side direction, the electromechanical coupling coefficient $k_{31}$ was 0.32 and was not changed from that of the non-oriented sample.

On the other hand, according to Sample Nos. 31, 32, and 34, since the direction of the {100} oriented crystal axis had a small inclined angle of 5° to 15° with respect to the short side direction in the plane including the short side direction and the long side direction or in the plane orthogonal to the long side direction and was approximately in parallel thereto, the electromechanical coupling coefficient $k_{31}$ was large, such as 0.36 to 0.38, and the rate of increase with respect to that of the non-oriented sample of Sample No. 13

The invention claimed is:

1. A piezoelectric ceramic electronic component comprising:
   a piezoelectric ceramic base body which contains a composite oxide having a perovskite type crystal structure as a primary component, the piezoelectric ceramic base body having at least one pair of opposed faces; and
   a pair of external electrodes adjacent respective surfaces of the opposed faces,
   wherein the piezoelectric ceramic base body includes a plurality of crystal particles and has a polyhedral shape having shape anisotropy,
   the respective surfaces of the opposed faces each have at least a first side and a second side parallel to each other,
   a width dimension of the piezoelectric ceramic base body in a direction orthogonal to the first side and the second side is larger than a length dimension of each of the first side and the second side,
   a crystal axis of the piezoelectric ceramic base body is {100} oriented in a direction parallel or approximately parallel to the first side and the second side, and
   a degree of orientation by a Lotgering method is 0.4 or more.

2. The piezoelectric ceramic electronic component according to claim 1, wherein the polyhedral shape of the piezoelectric ceramic base body is a rectangular parallelepiped shape.

3. The piezoelectric ceramic electronic component according to claim 1, wherein the opposed faces of the piezoelectric ceramic base body each at least have a parallelogram shape.

4. The piezoelectric ceramic electronic component according to claim 1, wherein the opposed faces of the piezoelectric ceramic base body each at least have a trapezoidal shape.

5. The piezoelectric ceramic electronic component according to claim 1, further comprising an internal electrode embedded in the piezoelectric ceramic base body.

6. The piezoelectric ceramic electronic component according to claim 5, wherein the internal electrode embedded in the piezoelectric ceramic base body has a flat shape.

7. The piezoelectric ceramic electronic component according to claim 1, wherein the width dimension is 1.25 times or more the length dimension.

* * * * *